United States Patent [19]

Negishi

[11] Patent Number: 4,916,340
[45] Date of Patent: Apr. 10, 1990

[54] MOVEMENT GUIDING MECHANISM

[75] Inventor: Mahito Negishi, Yokohama, Japan

[73] Assignee: Canon Kabushiki Kaisha, Tokyo, Japan

[21] Appl. No.: 299,342

[22] Filed: Jan. 23, 1989

[30] Foreign Application Priority Data

Jan. 22, 1988 [JP] Japan .................................. 63-12138
Jan. 29, 1988 [JP] Japan .................................. 63-17335

[51] Int. Cl.$^4$ ............................................ H02K 41/00
[52] U.S. Cl. .......................................... 310/12; 310/53
[58] Field of Search ...................... 310/12, 13, 14, 15, 310/52, 53, 54; 318/135

[56] References Cited

U.S. PATENT DOCUMENTS 4,541,747  9/1985  Imaizumi et al. ...................... 310/53
4,744,675  5/1988  Sakino et al. .......................... 384/12
4,788,477  11/1988  Teramachi ............................. 310/12

FOREIGN PATENT DOCUMENTS

58-122728  7/1983  Japan .
62-4538    1/1987  Japan .

Primary Examiner—Patrick R. Salce
Assistant Examiner—Judson H. Jones
Attorney, Agent, or Firm—Fitzpatrick, Cella, Harper & Scinto

[57] ABSTRACT

Movement guiding device includes two parallel stationary guides provided on a surface plate, a plurality of hydrostatic gas bearing members provided in relation to the surface plate and the stationary guides for supporting a Y stage, a plurality of hydrostatic gas bearing members provided in relation to the surface plate and the Y stage for supporting an X stage, two linear motors provided outside the stationary guides for moving the Y stage in a Y direction, and a linear motor coupled integrally to the Y stage for moving the X stage in an X direction. The Y stage moving linear motor has a stator fixed to the surface plate and a moving element fixed to the Y stage. The X stage driving linear motor has a stator fixed to the Y stage and a moving element fixed to the X stage. Each stator and each moving element are fixed to a corresponding component with a predetermined interspacing thereto defined by spacers of polycarbonate, while each interspacing is filled with a heat insulating material such as expanded polystyrene, for example. With this structure, without interfering with the transmission of the drive force of each linear motor, the transmission of heat generated by the linear motor to the surface plate is effectively prevented. In one embodiment, a cooling medium is supplied to a coil supporting member in accordance with a difference in temperature between the surface plate and the linear motor.

13 Claims, 8 Drawing Sheets

MOVEMENT GUIDING MECHANISM

FIELD OF THE INVENTION AND RELATED ART

This invention relates to a movement guiding device and, more particularly, to a movement guiding device suitably usable in a semiconductor device manufacturing apparatus, a fine machining tool or other apparatus, for moving and positioning a movable member such as, for example, an X-stage or a Y-stage, by use of a linear motor means.

Figures 14A, 14B:
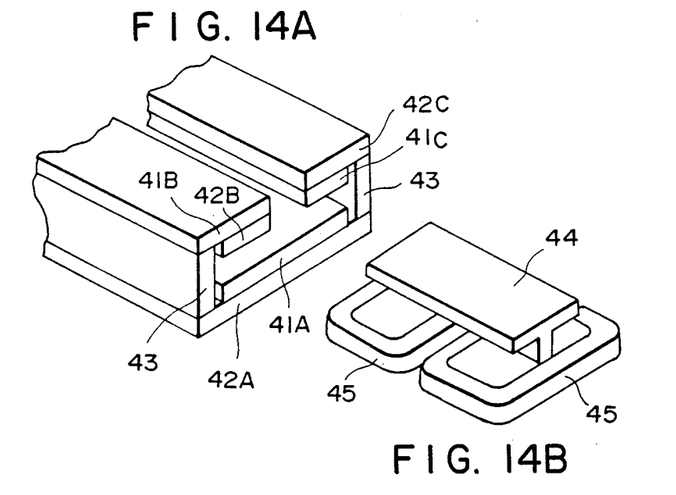
FIGS. 14A and 14B are views schematic of a known type of linear motor.

Proposals have been made for developing a movement guiding device wherein a movable member is moved along a predetermined guide by using a linear motor so that it is positioned at a desired or predetermined site. FIGS. 14A and 14B illustrate perspective views of a major portion of a multi-pole type linear motor used in such a known movement guiding device. In the linear motor as illustrated in FIGS. 14A and 14B, a permanent magnet (field magnet) 41A and a yoke 42A are disposed on one side and, on the other side, there are provided permanent magnets 41B and 41C and yokes 42B and 42C which are opposed to the permanent magnet 41A with a spacing defined by spacers 43 made of a non-magnetic material. Through the spacing defined therebetween, coils 45 wound around a coil bobbin 44 are displaced. The position and speed of the coil structure 45 is controlled by the electric current and the frequency of the current supplied to the coil structure 45.

Usually, in such a movement guiding device, the movable member is fixed to the coil bobbin 44, while the yoke 42A is directly coupled to a surface plate which is a base member. When an electric current is applied to the coil 45, there is produced Joule heat and, for this reason, the temperature of the coil bobbin 44, the permanent magnets 41A–41C and the yokes 42A–42C increases. As a result, the temperature of the movable member and/or the surface plate to which the coil bobbin 44 or the yokes 42A–42C or otherwise are coupled increases.

The increase in the temperature of the movable member or the surface plate causes flexure of its shape and thus deformation thereof. As a result, there occurs degradation of the accuracy of the movement of the movable member. For example, a temperature difference of 0.5° C. between the upper and lower surfaces of a surface plate having a thickness 40 mm may create an inclination error of about 3.6 milli-radian assuming that the movable member has a movable range of 250 mm. Japanese Laid-Open Patent Application, Laid-Open No. Sho 62-4538 proposes a movement guiding device in which specific attention is paid to the deterioration of the accuracy of the movement of a movable member due to the heat generation of a linear motor. However, the problem resulting from the heat generation is not satisfactorily solved.

SUMMARY OF THE INVENTION

It is an object of the present invention to provide a movement guiding device for moving a movable member by using a linear motor, such that the heat produced by the linear motor is effectively insulated so as not to be transmitted to the movable member or a surface plate, so that high-precision movement is attainable.

In accordance with one aspect of the present invention, to achieve this object, there is provided a movement guiding device wherein a movable member is supported by a surface plate through a hydrostatic bearing means and wherein a moving element of a linear motor, moving the movable member in a predetermined direction, is coupled to the movable member while a stator of the motor is coupled to the surface plate. As an important feature, the moving element of the linear motor or the stator of the motor is coupled to an associated component by use of a specific spacer, and the interspacing defined between the moving element or the stator and its associated component is filled with a heat insulating material. With this arrangement, the heat transmission from the linear motor to the surface plate is effectively prevented without interfering with the transmission of a drive force of the linear motor. As a result, undesirable deterioration of the accuracy of the movement of the movable member due to any thermal deformation of the surface plate is effectively prevented.

It is another object of the present invention to provide a movement guiding device wherein no temperature distribution is produced on the surface plate as a result of the heat generation by the linear motor, thereby resulting in the attainment of high-precision movement control.

In accordance with another aspect of the present invention, to achieve this object, a cooling means is provided to supply a cooling medium to a support for supporting coils of the linear motor, the cooling means being controlled so that no temperature difference is produced between the linear motor and the surface plate which is a movement reference member for a movable stage. If there is no temperature difference, heat does not flow. Therefore, undesirable deformation of the surface plate due to the heat generation of the linear motor is effectively prevented.

These and other objects, features and advantages of present invention will become more apparent upon a consideration of the following description of the preferred embodiments of the present invention taken in conjunction with the accompanying drawings.

DESCRIPTION OF THE PREFERRED EMBODIMENTS

Figure 1:
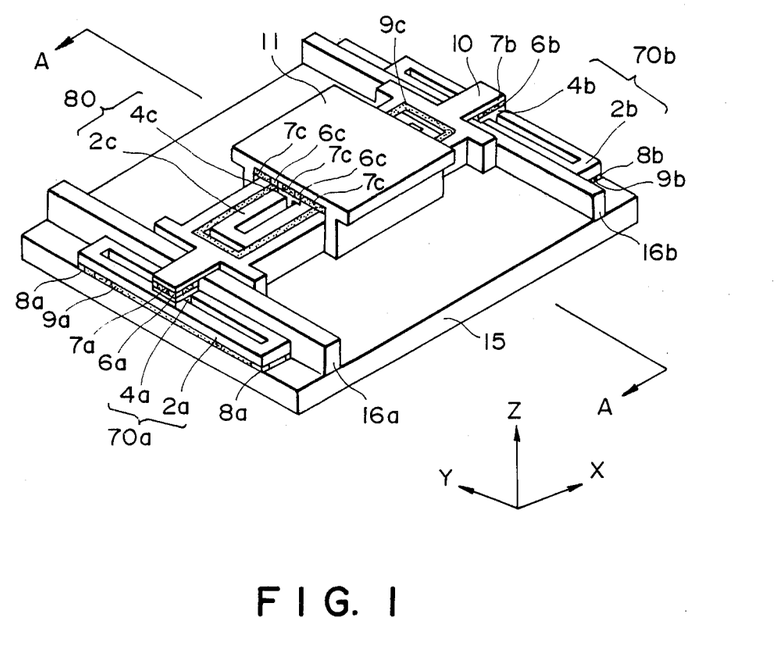
FIG. 1 is a perspective view schematically showing a movement guiding device according to an embodiment of the present invention.
Figure 2:
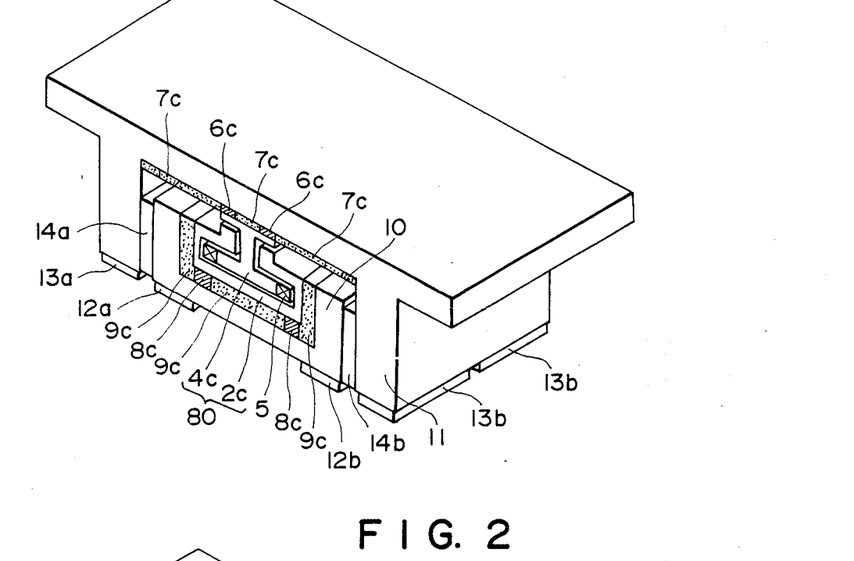
FIG. 2 is a perspective section, cut along a line A—A in FIG. 1.

FIG. 1 is a perspective view showing a major portion of an embodiment of the present invention, and FIG. 2 is a section taken along a line A—A in FIG. 1. Denoted at 15 is a surface plate whose upper surface provides a smooth reference surface. The movement guiding device includes a Y stage (first movable member) 10 which is movable along the surface plate 15 in a Y-axis direction, and an X stage (second movable member) 11 which is movable in an X-axis direction while using the Y stage 10 as a guide. The X stage 11 is disposed so as to straddle the Y stage 10. There are provided two stationary guides 16a and 16b which are fixed to the surface plate 15 and function to guide the Y stage 10 in the Y-axis direction. Denoted in FIG. 2 at 12a, 12b, 13a, 13b, 14a and 14b are hydrostatic gas or air bearing members each being made of a porous material. Of these members, the bearing members 14a and 14b function to restrict the position of the X stage 11 in the Y-axis direction. The bearing members 13a and 13b function to restrict the position of the X stage 11 relative to the surface plate 15 in a direction perpendicular to the surface plate, i.e., in a Z-axis direction in this embodiment. The bearing members 12a and 12b function to restrict the position of the Y stage 10 relative to the surface plate 15 in the perpendicular direction. Also, the position of the Y stage 10 in the X-axis direction is restricted by a hydrostatic gas or an air bearing means (not shown) provided between the Y stage 10 and the stationary guides 16a and 16b.

Denoted at 70 and 70' are linear motors for driving the Y stage 10, and denoted at 80 is a linear motor for driving the X stage 11. Each of these linear motors is of a movable coil type.

Each linear motor 70 or 70' for the Y stage 10 has a stator 2a or 2b which is fixed to the surface plate 15 by spacers 8a or 8b (only some of which are illustrated) each being made of a plastic material such as polycarbonate having a small heat conductivity as compared with iron or the like. Interspacing is defined by these spacers 8a or 8b between the surface plate 15 and the stator 2a or 2b, and the whole of such interspacing is filled with a heat insulating material 9a or 9b made of an organic or resinous material such as, for example, expanded polystyrene.

Similarly, the linear motor for the X stage 11 has a stator 2c which is, as best seen in FIG. 2, fixedly secured within a recessed portion of the Y stage 10 by spacers 8c made of a similar plastic material. Interspacing is defined between the stator 2c and the inside wall of the recessed portion of the Y stage 10, and the whole interspacing is filled with a heat insulating material 7c sush as, for example, expanded polystyrene.

Referring again to FIG. 1, moving element (coil bobbin) 4a or 4b of each linear motor 70 or 70' for the Y stage 10 is coupled to the Y stage by spacers 6a or 6b each being made of a similar plastic material such as polycarbonate, for example. Interspacing is defined by these spacers 6a or 6b between the moving element 4a or 4b and the Y stage 10, and the whole interspacing is filled with a heat insulating material 7a or 7b made of expanded polystyrene, for example. Similarly, the linear motor 80 for the X stage 11 has a moving element 4c as shown in FIG. 2, which moving element is coupled to the X stage 11 by spacers 6c made of a plastic material. On the surface of the X stage 11 on which the spacers are mounted, throughout the range as opposed to the Y stage 10 there is provided a heat insulating material layer 7c made of an expanded polystyrene material, for example, the insulating material being formed so as to be positioned between the X stage 11 and the moving element 4c. Reference numeral 5 in FIG. 2 denotes a coil.

In the present embodiment, as illustrated in FIG. 1, the Y stage 10 is so structured that it is floated from the surface plate 15 by the supply of gas pressure to the hydrostatic gas bearing members 12a and 12b while it is moved in the Y-axis direction along the stationary guides 16a and 16b means of the two linear motors 70 and 70'.

On the other hand, the X stage 11 is so structured that it is floated from the surface plate 15 by the supply of gas pressure to the hydrostatic gas bearing members 13a, 13b, 14a and 14b, like the Y stage 10, while it is moved in the X-axis direction by means of the linear motor 80 with using the side surfaces of the Y stage 10 as a guide means.

At this time, the X stage 11 and the Y stage 10 are adjusted by means of a plurality of known type preloading magnet units (not shown) so that each stage is surely kept at a constant attitude. Upon movement of the X stage 11 or the Y stage 10, there is produced Joule heat as a result of an electric current flowing through the coil (e.g. coil 5) of the linear motor. By this heat, the temperature of the moving element 4a, 4b or 4c and/or the stator 2a, 2b or 2c increases.

In consideration of this, in the present embodiment, the heat insulating materials 7a–7c and 9a–9c are provided to intercept the heat transmission to the neighboring X stage 11 the, Y stage 10 and the surface plate 15. As a consequence, undesirable temperature increase in these components is effectively prevented.

Further, in this embodiment, each linear motor is coupled rigidly to the X stage 11 or the Y stage 10 by using relatively hard spacers. With this structure, undesirable vibration which might be caused when the coupling of the linear motor is weak is reduced, and, thus, high-precision movement of the X stage 11 and the Y stage 10 is assured.

Additionally, in this embodiment, the guide for both the X stage 11 and the Y stage 10 in the vertical direction is made by the surface plate 15, such that the displacement of one of the X stage 11 and the Y stage 10 does not produce a moving load applied to the other. As a result, a good static attitude can be retained.

Figure 3:
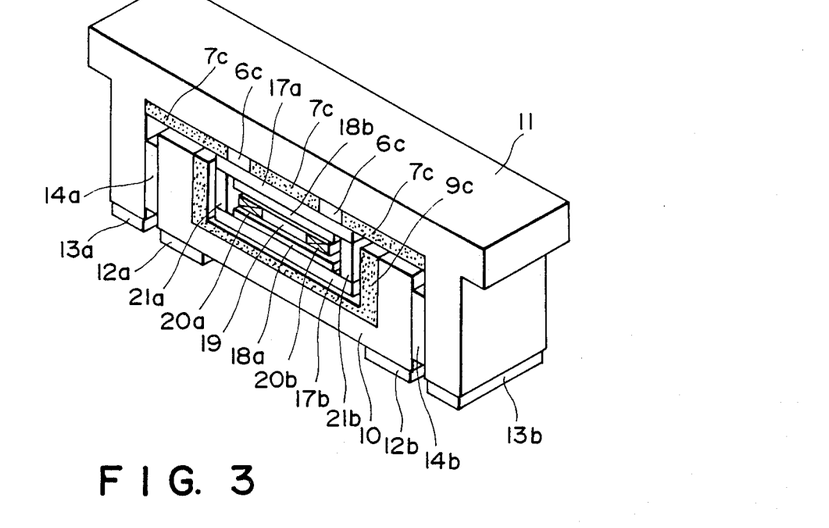
FIG. 3 is a view similar to FIG. 2, but shows a movement guiding device according to another embodiment of the present invention.

FIG. 3 schematically shows a major portion of another embodiment of the present invention, wherein linear motors of movable magnet type are used. The same numerals as in the FIG. 2 embodiment are assigned to corresponding or similar elements in the FIG. 3 embodiment.

In this embodiment, a Y stage (first movable member) 10 is supported by hydrostatic gas bearing members 12a and 12b with respect to a vertical direction. On the other hand, an X stage (second movable member) 11 is supported by hydrostatic gas bearing members 13a and 13b in the vertical direction, while it is supported by hydrostatic gas bearing members 14a and 14b in a lateral direction. There are provided a pair of permanent magnets 18a and 18b and a pair of yokes 17a and 17b. One permanent magnet and one yoke on one side are disposed opposed to the other permanent magnet and the other yoke on the other side with the intervention of spacers 21a and 21b. Within the spacing defined by these elements, a coil bobbin (stator) 19 having coils 20a and 20b is disposed.

Among the yokes (moving elements) 17a, 17b, the permanent magnets 18a and 18b, and the spacers 21a and 21b, the yoke 17a on one side is coupled to the X stage 11 through spacers 6a and 6b so that it is movable rectilinearly with the X stage 11. On the other hand, the coils 20a and 20b and the coil bobbin 19 on the stator side are fixed to the Y stage 10.

The interspacing between the yoke (moving element) 17a and the X stage 11 is filled with a heat insulating material layer 7c, while another heat insulating material layer 9c is formed and provided upon the Y stage 10 so as to cover the movable range of the moving element.

With the movement of the X stage 11, there is produced Joule heat due to the flow of an electric current through the coils 20a and 20b. As a result, the temperature of the moving element such as the yoke 17a, for example, as well as the temperature of the stator such as the coil bobbin 19, for example, increases. In consideration thereof, in this embodiment, the heat insulating material layer 7c is used to prevent transmission of heat to the X stage 11 and, additionally the heat insulating material layer 9c is used to prevent transmission of heat of the Y stage 10. With the structure, an undesirable temperature increase in the X stage 11, the Y stage 10 and the surface plate 15 can be effectively prevented, with a result that undesirable deterioration of the accuracy of the movement of the X stage and the Y stage due to thermal deformation can be effectively prevented.

According to the present embodiment, as described hereinbefore, the portion neighboring a coil or coils of a linear motor is encircled by a heat insulating material, with the advantageous result that transmission of heat produced by the coil or coils to an X stage and a Y stage as well as to a surface plate can be effectively prevented. As a consequence, it is possible to provide a movement guiding device wherein degradation of the accuracy of the movment of a stage due to thermal deformation thereof is prevented so that high-precision movement is attained. Further, the drive force of a linear motor is transmitted by using hard spacers made of a plastic material such as polycarbonate, for example. This is effective because a sufficient mechanical strength is obtainable. Also it allows use of such a heat insulating material (such as expanded polystyrene, for example) which is inconveniently soft but has a high heat insulating effect.

Figure 4:
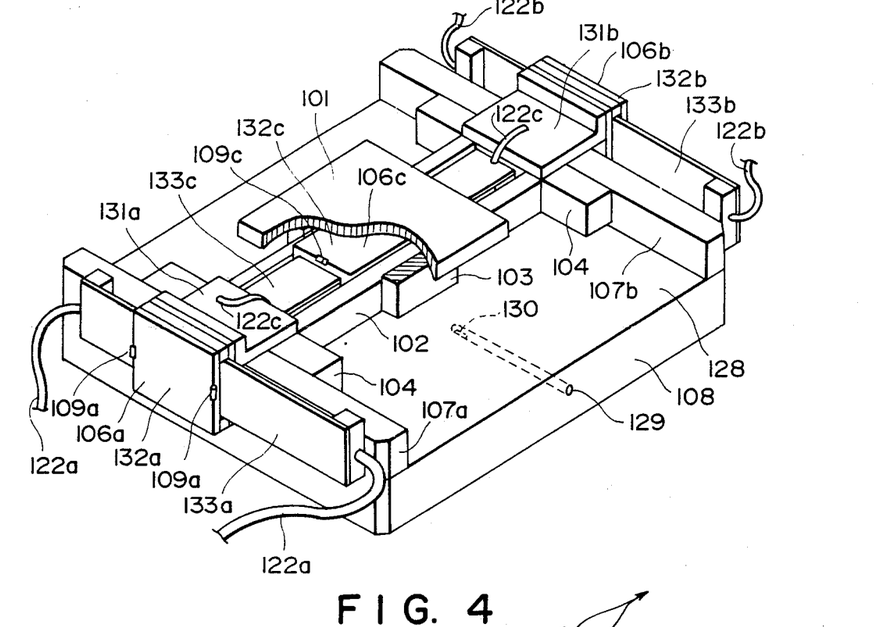
FIG. 4 is a perspective view schematically showing a movement guiding device according to a further embodiment of the present invention.

FIG. 4 shows a movement guiding device according to a further embodiment of the present invention. The device of this embodiment includes a base 108; two parallel guide 107a and 107b which are disposed on an upper surface of the base 108 so as to extend along opposite side edges of the base 108 and thus to be opposed to each other; a Y stage 102 mounted to extend between these two guides 107a and 107b; and an X stage 101 mounted on the Y stage 102. The upper surface of the base 108 provides a precision reference surface 128. Namely, the upper surface of the base 108 has been finished with high flatness of 0.5 micron, for example. The Y stage 102 is supported by the guides 107a and 107b in a horizontal direction through a gas bearing means (not shown), while it is supported by the base 108 in a vertical direction through a similar gas bearing means (not shown). The Y stage 102 is slidable rectilinearly along the guides 107a and 107b. On the other hand, the X stage 101 is supported by the Y stage 102 in a horizontal direction through a gas bearing means (not shown), while it is supported on the base 108 in the vertical direction through a gas bearing means (not shown). The X stage 101 is slidable on the Y stage 102 surface in a direction orthogonal to the moving direction of the Y stage 102. Denoted at 103 is a mounting plate on which hydrostatic gas bearing members for the X stage are mounted, and denoted at 104a and 104b are mounting plates on which hydrostatic gas bearing members for the Y stage are mounted.

Linear motor 106c which is a driving means for the X stage 101 is mounted within the Y stage 102. On the other hand, linear motors 106a and 106b which are driving means for the Y stage 102 are mounted to the outside surfaces of the two guides 107a and 107b, respectively. Each of these linear motors 106a–106c has a stator 133a, 133b or 133c and a moving element 132a, 132b and 132c which is slidable on the stator. Each moving element 132a, 132b or 132c has two temperature sensors 109a, 109b or 109c mounted thereto. Each stator 133a, 133b or 133c has a cooling medium flowing passageway formed therein and having opposite ends to which flexible tubes 122a, 122b or 122c are connected for circulation of a cooling medium. The base 108 has a hole 129 formed therein, and a temperature sensor 130 is disposed within this hole.

Figure 5:
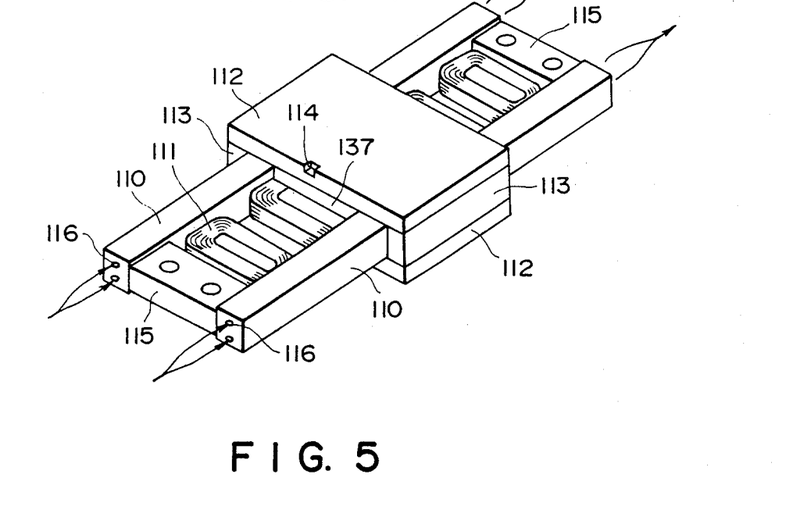
FIG. 5 is an enlarged perspective view of a linear motor used in the FIG. 4 embodiment.

The structure of a linear motor usable in this embodiment is shown in FIG. 5. Two permanent magnets 137 are disposed opposed to each other, and two yokes 112 defining paths of magnetic fluxes are mounted to these magnets, respectively. The upper and lower yokes 112 are coupled to each other through spacers 113, to provide a box-like moving element. Coils 111 are fixedly provided between two coil supporting members 110. The two coil supporting members 110 are coupled to each other by means of coupling members 115, to provide a stator. Since the coils 111 of the stator are disposed within a magnetic field formed by the box-like moving element, the energization of these coils 111 can produce a propelling or driving force. Cooling medium flowing passageway 116 is formed in each coil supporting member 110, in order to remove Joule heat produced by the application of electrical energy to the coils 111.

Figure 6:
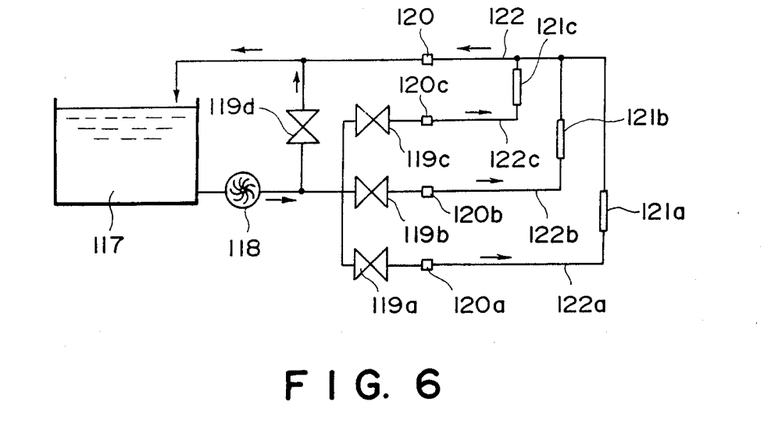
FIG. 6 is a diagram of a cooling medium flowing path of a temperature controlling device used in the FIG. 4 embodiment.

The path of flow of the cooling medium is illustrated in FIG. 6. A suitable amount of a cooling medium (e.g. water) is contained in a cooling medium tank 117, and a constant temperature of the contained cooling medium is maintained by means of a temperature adjusting device (not shown). The cooling medium can be circulated through a passageway means including the flexible tubes 122a–122c, by means of a pump 118 and with the aid of four solenoid valves 119a, 119b, 119c and 119d. These solenoid valves are controlled automatically by a temperature controlling circuit which will be described later, so as to allow/intercept the flow of the cooling medium.

The controlled flow of cooling medium is coupled to the flexible tubes 122a-122c by way of respective detachably mountable connectors 120a, 120b and 120c, so that the cooling medium can be introduced into cooling conduit means 121a, 121b and 121c (cooling medium passageways 116 in FIG. 5) for the linear motors. This arrangement allows removal of a controlled quantity of heat from each linear motor 106a, 106b or 106c by the selective flow of the cooling medium. The tubes from the cooling conduit means of the linear motors 106a-106c are combined into one pipe and, after passing a flexible tube 122 and a detachably mountable connector 120, the flowing path is combined with an outlet of a by-passing solenoid valve 119d and then returns to the cooling medium tank 117. Since flexible tube means is used, the cooling mechanism does not interfere with the motion of the stage 101 or 102 when it moves. Also, disconnecting the connectors 120 and 120a-120c, the assembling, maintenance or otherwise of the movement guiding device can be made easier.

Figure 7:
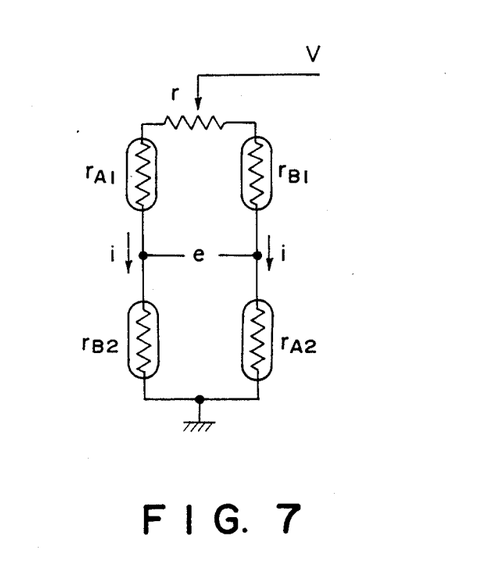
FIG. 7 is a diagram of a temperature detecting circuit of the temperature controlling device used in the FIG. 4 embodiment.

FIG. 7 shows the configuration of a temperature detecting circuit usable in this embodiment. Resistors $r_{A1}$, $r_{A2}$, $r_{B1}$ and $r_{B2}$ are thermometering resistors (temperature sensors) each being provided by a platinum resistance thermometer, for example. Such a resistor has the characteristic that its resistance S varies with change in the temperature of an article being examined. These four temperature sensors are connected in a bridge-like fashion as illustrated, and are coupled to a constant voltage source V by means of a variable resistor r.

The temperature sensors $r_{A1}$ and $r_{A2}$ are used in pairs and are disposed, as the paired temperature sensors 109a, 109b or 109c as shown in FIG. 4, within a temperature sensor mounting pit 114 (see FIG. 5) which is formed in a portion of a corresponding linear motor (e.g. the yoke 112 of the linear motor in the FIG. 5 example). The other pair of the temperature sensors $r_{B1}$ and $r_{B2}$ are used and disposed, as the temperature sensing means 130 (FIG. 4) within another temperature sensor mounting pit (such as the hole 129) formed in a separately provided temperature control reference member such as, for example, a surface plate or the base 108 shown in FIG. 4 upon which the moving table mechanism is placed. The resistance of a platinum thermometering resistor changes linearly with the temperature, as can be expressed by the equation $r = R + \alpha \cdot \Delta T$, wherein r is the resistance of the platinum thermometering resistor, R and $\alpha$ are constants and $\Delta T$ is the change in temperature. Where the temperature changes as sensed by the four sensors $r_{A1} - r_{B2}$ are denoted by $\Delta T_{A1}, \Delta T_{A2}, \Delta T_{B1}$ and $\Delta T_{B2}$, respectively, an output voltage e can be expressed by the following equation, on condition that the variable resistance r for fine adjustment is small:

$$E \approx (\alpha V/2R)[(\Delta T_{A1} + \Delta T_{A2})/2 - (\Delta T_{B1} + \Delta T_{B2})/2]$$

Figure 13:
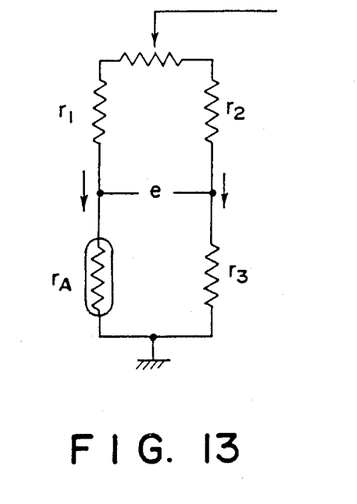
FIG. 13 is a diagram of a known type of temperature detecting circuit.

From this equation, it is seen that the output e is an electric voltage which is proportional to the difference between an average temperature of the paired temperature sensors $r_{A1}$ and $r_{A2}$ and an average temperature of the paired temperature sensors $r_{B1}$ and $r_{B2}$. As compared with the conventional temperature detecting circuit as illustrated in FIG. 13, the structure used in this embodiment can provide various advantages for example, for the stable measurement of temperature free from any drift error, in the conventional circuit it is usually necessary that the precision of a reference resistor $r_3$ is high and that the temperature coefficient is very low. However, where sensors are used in a bridge-like structure as in the present embodiment, use of a reference resistor is not necessary. Additionally, it is possible to obtain an output proportional to the temperature difference with respect to a reference temperature.

Figure 8:
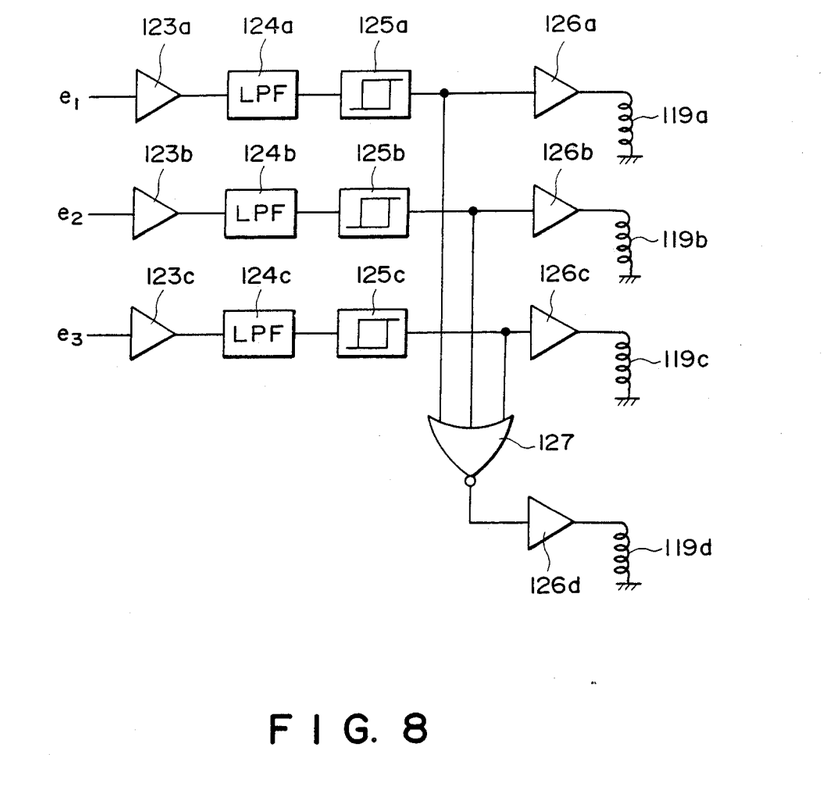
FIG. 8 is a diagram of a temperature controlling circuit of the temperature controlling device used in the FIG. 4 embodiment.

FIG. 8 exemplifies the structure of a temperature controlling circuit usable in this embodiment. The bridge circuitry of the described temperature sensors corresponding to the three linear motors produces outputs e1-e3 which are amplified by amplifiers 123a, 123b and 123c, respectively. The amplification rate of each amplifier is 100 dB, for example. Any noise component as amplified by each amplifier is introduced into and attenuated by corresponding one of low-pass filters 124a, 124b and 124c. Since the temperature changes relatively gradually, the cut-off frequency of each low-pass filter may be low. For example, it is 1 Hz. The signal passing through the low-pass filter 124a, 124b or 124c is applied to corresponding one of hysteresis circuits 125a, 125b and 125c, whereby it is recitified into an ON/OFF signal for opening/closing an associated solenoid valve. The ON/OFF signal is applied through a corresponding power amplifiers 126a, 126b or 126c to associated one of solenoid valves 119a, 119b and 119c to open/close the same. The temperature controlling circuit shown in FIG. 8 includes three portions corresponding to the three inputs e1-e3, respectively, which three portions are used in association with the three linear motors 106a-106c, respectively, as having been described with reference to FIG. 4. The by-passing solenoid valve 119d is controlled by a NOR circuit 127, more particularly, a circuit which is brought into an "ON" state when the three solenoid valves 119a-119c corresponding to the three linear motors 106a-106c are all closed, i.e. a circuit ($\overline{A} \cap \overline{B} \cap \overline{C} = \overline{A \cup B \cup C}$) where the ON/OFF logics of the three solenoid valves 119a, 119b and 119c are denoted by A, B and C, respectively.

The operation of the present embodiment having the described structure will now be explained. For drive of a stage, electric power is applied to the coils 111 (FIG. 5) of a corresponding linear motor. In response, the moving element comprising the yoke 112 moves rectilinearly and, at the same time, there is produced Joule heat at the coils 111. At the maximum, the magnitude of the heat is 12.5 W in this embodiment. If the heat is transmitted through some components to the base 108 (FIG. 4), there is produced a temperature distribution in the base 108. If the base 108 deforms due to such a temperature distribution, the moving accuracy of X stage 101 and/or the Y stage 102 is degraded because in this embodiment the base 108 provides a precision reference. However, such a problem can be solved by the present embodiment. More specifically, in this embodiment, the temperature increase in the coils 111 of the linear motor due to the heat generation at the coil 111 causes an increase in the temperature of each of the yokes 112 and the spacers 113 which surround the coils 111, with the result that the resistance of each of the temperature sensors $r_{A1}$ and $r_{A2}$ mounted within the temperature sensor mounting pit 114 (FIG. 5) increases. On the other hand, since the temperature increase in the base 108 is slower than the temperature increase in the yokes 112 of the linear motor, the resistance of each of the reference temperature sensors $r_{B1}$ and $r_{B2}$ mounted to the base 108 does not change. As a result, the balanced state of the temperature difference detecting bridge circuit as illustrated in FIG. 7 is destroyed and, as a consequence, output voltages e1, e2 and e3 are produced. Those voltages e1-e3 each being proportional to the temperature difference between the base 108 and corresponding one of the linear motors 106a-106c are introduced to the circuitry shown in FIG. 8, wherein each voltage is amplified by corresponding one of the amplifiers 123a-123c and is rectified by using corresponding one of the low-pass filters 124a-124c and corresponding one of the hysteresis circuits 125a-125c and, thereafter, each voltage is used to open corresponding one of the solenoid valves 119a-119c with the aid of corresponding one of the power amplifiers 126a-126c. Referring back to FIG. 6, when the solenoid valves 119a-119c are opened, the cooling medium fed under pressure by means of the pump 118 flows into the flexible tubes 122a-122c and then to the linear motor cooling conduits 121a-121c (cooling passageway 116 in FIG. 2), whereby the heat caused by the Joule heat generation can be removed. As a result, by using this controlling circuit, the temperature difference between each linear motor 106a, 106b or 106c and the base 108 can be reduced to zero. If the temperature difference comes close to zero, the heat transfer can be suppressed or avoided. Therefore, the temperature of the base 108 can be stabilized. Since in this embodiment the flatness of the upper surface of the base 108 provides the precision reference, the assurance of the stableness of the base 108 temperature ensures high moving accuracy of the stage. This is because undesirable thermal deformation of the base 108 can be avoided.

In this case, the mounting position of each temperature sensor $r_A$ is important. The portion close to the coil at which heat is generated is relatively hot, whereas the portion close to the cooling conduit is relatively cold. Unless an average temperature of these portions is detected and the temperature control is made on the basis of the detection, it is difficult to remove heat of a suitable quantity. For example, according to experiments wherein a temperature sensor was mounted to the side surface of a coil 111, the temperature of the yoke 112 increased by 0.5° C. during a lapse of time of 1.5 hours and, along with that, the temperature of the Y stage 102 increased by 0.6° C. On the other hand, where the temperature sensor was mounted to the yoke 112, the temperature variation of the yoke 112 was suppressed to a range from −0.6 to +0.2° C. and the temperature of the Y stage 102 was not increased.

Figure 9:
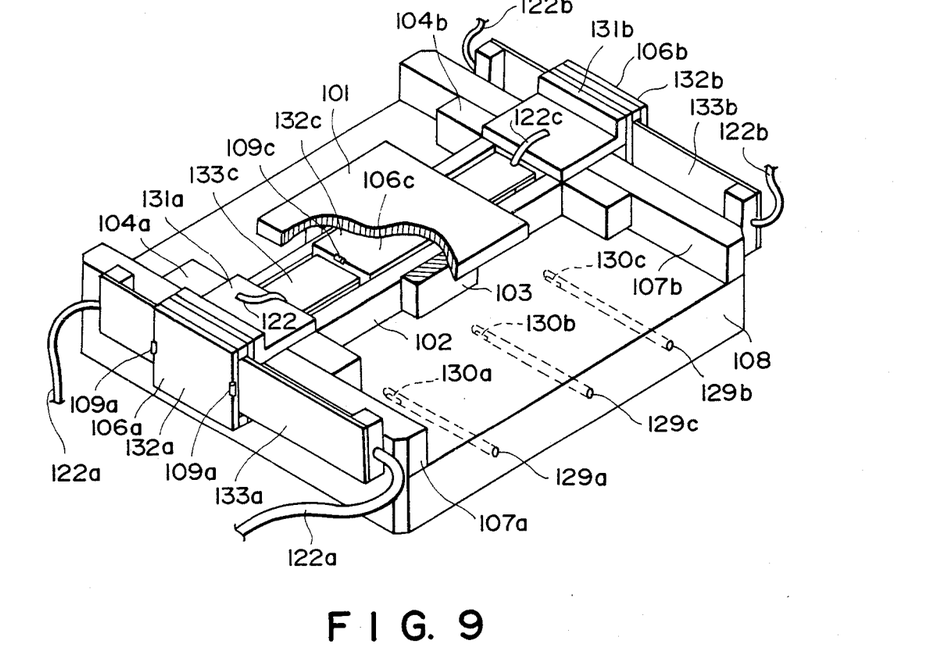
FIG. 9 is a perspective view of a movement guiding device according to still another embodiment of the present invention.

FIG. 9 shows a yet further embodiment of the present invention. In this embodiment, a base 108 is provided with a plurality of (three in this example) temperature reference measuring sensors 130a, 130b and 130c. Usually, a base member such as at 108 for use in a semiconductor device manufacturing exposure apparatus occupies a large area of about 400 mm × 400 mm. Therefore, it is not easy to remove the temperature distribution in the base 108 thereby to assure a complete uniform temperature therein. Thus, it is assumed in this embodiment that the base 108 is balanced with a certain temperature distribution. In the foregoing embodiment, a single temperature sensing means is provided within the base and the temperature sensed thereby is used as a reference temperature. As a result, there is a possibility that a temperature difference is produced between a linear motor and a portion of the base close to the linear motor. If there is a temperature difference, heat can flow such that the heat of the linear motor can be transmitted to the base.

In consideration thereof, in this embodiment, a larger number of reference temperature measuring points are set and, for each linear motor, an average temperature of such portion of the base member close to the linear motor is measured, the measured value being used as a reference temperature. More specifically, in the FIG. 9 example, for the temperature control of the linear motor 106a, an output of a sensor 130a disposed within a hole 129a formed at a position close to the linear motor 106a is used as a reference temperature, and the temperature control is made by using the temperature controlling circuit described hereinbefore so that the temperature difference between the linear motor 106a and the temperature sensor 100a comes to zero. Similarly, for the linear motor 106c of the X stage, a temperature sensor 130c provided within a hole 129c is used while, for the other linear motor 106b of the Y stage, a temperature sensor 130b provided within a hole 129b is used, the temperature control being performed by using the outputs of these sensors as reference temperatures. By providing plural reference temperature measuring points, it is possible to reduce, to zero, the temperature difference between each linear motor 106a, 106b or 106c and the portion of the base 108 close to that linear motor. Therefore, no heat transmission occurs between them. As a consequence, even if there is a temperature distribution in the base 108, the heat transfer between the base 108 and each linear motor 106a, 106b or 106c can be prevented, such that the temperature of the base 108 can be maintained in a steady state.

The remaining structure and function of the present embodiment are similar to those of the foregoing embodiment.

Figure 10:
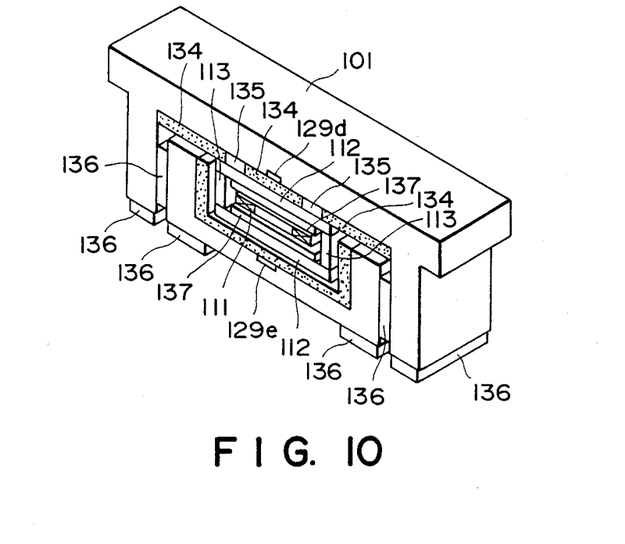
FIG. 10 is a view similar to FIG. 2, but shows a movement guiding device according to a still further embodiment of the present invention.

FIG. 10 shows a still further embodiment of the present invention. While the FIG. 9 embodiment is so structured that the heat transfer can be suppressed even if a temperature distribution is formed in the base 108, the FIG. 10 embodiment is structured so as to function under conditions where the temperature of the base 108 differs from the temperature of such a portion (e.g. an X stage 101 or a Y stage 102) which is other than the base 108 but which is relatively close to a linear motor. In these circumstances there is produced a temperature difference between the linear motor (heat generating member) and a member close to the motor, with the result of a flow of heat. In consideration thereof, the reference temperature measuring point is made closer to the linear motor and, by doing so, it is possible to reduce such a local temperature distribution.

FIG. 10 shows an X-Y stage of the movement guiding device as being cut along a plane which is perpendicular to the advancing direction of an X stage 101. Heat insulating material layer 134 is provided so as to prevent dispersion of heat, generated by a linear motor, toward neighboring components. Reference temperature measuring sensor 129d is mounted to the X stage 101. Alternatively or additionally, reference temperature measuring sensor 129d or another reference temperature measuring sensor may be mounted to a Y stage 102, such as depicted at 129e. By providing the sensor 129d and/or the sensor 129e at such position and by executing the temperature control in a similar manner as described above, it is possible to reduce, to zero the average temperature difference between the linear motor and the X stage 101 and/or the Y stage 102 and, as a result, it is possible to suppress the heat transfer.

Figure 11:
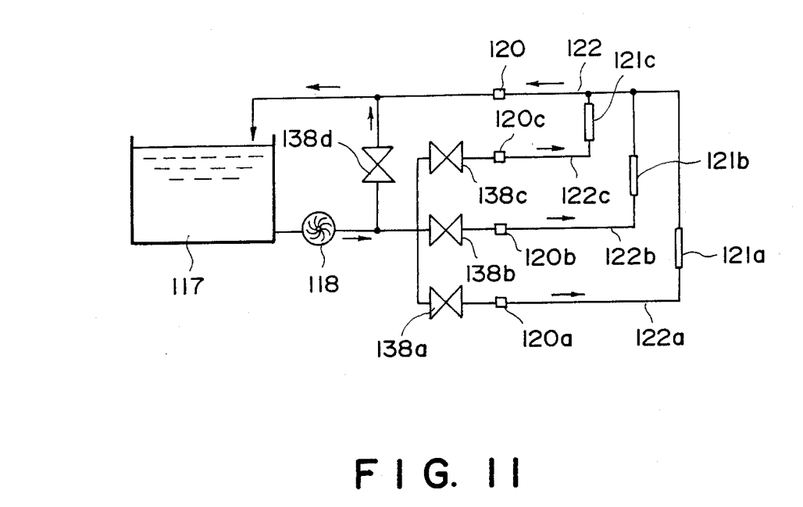
FIG. 11 is a diagram showing another example of a cooling medium path of a temperature controlling device usable in the present invention.
Figure 12:
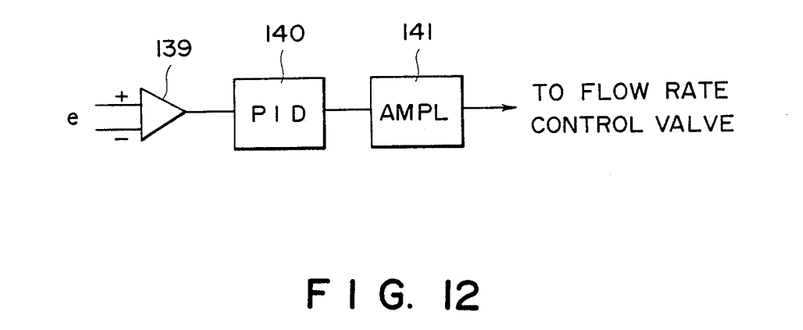
FIG. 12 is a block diagram of a controlling circuit of a temperature controlling device used in the FIG. 11 embodiment.

FIG. 11 shows a yet further embodiment of the present invention. In the FIG. 4 embodiment, solenoid valves such as at 119a-119c are used to control of the flow rate the cooling medium. As a result, the speed of the cooling medium changes quickly upon the ON-/OFF action of the solenoid valve. Such a rapid change may cause impact vibration which may result in vibration of the flexible tubes 122a-122c or the linear motors 106a-106c communicating with the cooling conduits 121a-121c. Such vibration is not desirable in an apparatus wherein fine movement control is required. In consideration of this, as illustrated in FIG. 11, the solenoid valves are replaced by flow rate controlling valves 138a, 138b and 138c each being of a flow-rate variably adjustable type, so as to prevent impactive change in the flow rate. A valve controlling circuit usable in that case is shown in FIG. 12. Illustrated in FIG. 12 is a circuitry which is operable to control, by using the outputs e of the temperature sensor means described with reference to FIG. 7, the above-described flow-rate controlling valves 138a-138c with the aid of an ordinary PID controller 140 and a flow-rate controlling valve actuating power amplifier 141. Similar to the foregoing embodiment, a by-passing valve 138d is provided which is openable when all the three valves 138a-138c are closed. With this structure, the flow rate can be changed relatively gradually and, for this reason, undesirable vibration due to a sudden change in the flow rate can be avoided.

In accordance with the present invention, as has hitherto been described, a temperature controlling device is provided by which any temperature difference between an average temperature of a base member (which is a precision reference member for an X stage and a Y stage) and an average temperature of a motor portion (which is a heat generating member) can be reduced to zero. As a result, heat transfer to or from the precision reference member for the stage can be suppressed and-/or any temperature distribution of such precision reference member can be made stable and steady. Consequently, the stableness in shape of the precision reference member is assured so that high moving accuracy of a movable table can be retained.

The present invention is effective particularly when, as in the structures described with reference to the embodiments, a heat generating member is disposed relatively close to the precision reference member.

While the invention has been described with reference to the structures disclosed herein, it is not confined to the details set forth and this application is intended to cover such modifications or changes as may come within the purposes of the improvements of the scope of the following claims.

What is claimed is:

1. A movement guiding device, comprising:
   a surface plate;
   a stationary guide fixedly provided on said surface plate;
   a movable member supported by said surface plate and said stationary guide through a hydrostatic bearing member and being movably guided in a predetermined direction, said movable member being supported by said surface plate in a direction perpendicular to said surface plate while being supported by said stationary guide in a horizontal direction;
   a linear motor for moving said movable member relative to said surface plate in said predetermined direction, said linear motor having a stator fixed to said surface plate with a predetermined interspacing thereto defined by a spacer, said linear motor also having a moving element fixed to said movable member with a predetermined interspacing thereto defined by another spacer; and
   a heat insulating material which occupies each of said interspacings.

2. A device according to claim 1, wherein each of said spacers is made of a plastic material and wherein said heat insulating material is made of an expanded material.

3. A movement guiding device, comprising:
   a surface plate;
   two stationary guides fixedly provided on said surface plate;
   a first movable member placed on said surface plate so as to be sandwiched between said stationary guides, said first movable member being supported by said surface plate and said stationary guides through a hydrostatic bearing member;
   a second movable member placed on said surface plate so as to straddle said first movable member, said second movable member being supported by said surface plate and said first movable member through a hydrostatic bearing member;
   a first linear motor for moving said first movable member relative to said surface plate in a first direction, said first linear motor having a stator fixed to said surface plate with a predetermined interspacing thereto defined by a spacer, said first linear motor further having a moving element fixed to said first movable member with a predetermined interspacing thereto defined by another spacer;
   a first heat insulating material which occupies each of said interspacings;
   a second linear motor for moving said second movable member relative to said first movable member in a second direction which is orthogonal to said first direction, said second linear motor having a stator fixed to said first movable member with a predetermined interspacing defined by a spacer, said second linear motor further having a moving element fixed to said second movable member with a predetermined interspacing thereto defined by another spacer; and
   a second heat insulating material which occupies each of said interspacings defined in said second linear motor.

4. A device according to claim 3, wherein each of said spacers is made of a plastic material and wherein each of said first and second heat insulating materials is made of an expanded material.

5. A device according to claim 3, further comprising plurality of said first linear motors disposed outside of said stationary guides.

6. A movement guiding device, comprising:
   a surface plate;
   a movable member supported by said surface plate through a hydrostatic bearing member;
   a linear motor for moving said movable member relative to said surface plate, said linear motor having a stator fixed to said surface plate and a moving element fixed to said movable member;

a first temperature detector for detecting the temperature of said surface plate;

a second temperature detector for detecting the temperature of said linear motor;

cooling means for cooling said linear motor, said cooling means being operable to supply a cooling medium, from a cooling medium tank and through a flexible tube, to a supporting member supporting a driving coil of said linear motor; and control means for controlling said cooling means so as to reduce, to zero, a difference in temperature detected by said first and second temperature detectors, said control means being operable to change the quantity of the cooling medium to be supplied to the supporting member.

7. A device according to claim 6, wherein said cooling means includes a circulation passageway for circulating the cooling medium from the cooling medium tank through the supporting member and back to the cooling medium tank, a cooling medium by-passing passageway for by-passing the cooling medium back to the cooling tank without passing the cooling medium through the supporting member, and a plurality of flow controlling valves provided in said cooling medium circulating passageway and said cooling medium by-passing passageway for adjusting the flow rate of the cooling medium therethrough.

8. A device according to claim 6, wherein said first and second temperature detectors include thermometering resistors which are provided in a bridge circuit so that an output corresponding to a difference in resistance of said resistors is produced.

9. A device according to claim 6 further comprising a plurality of said first temperature detectors disposed in different portions of said surface plate.

10. A device according to claim 6, wherein said second temperature detector is mounted to a yoke of said linear motor.

11. A movement guiding device, comprising:
a surface plate;
a movable member supported by said surface plate through a hydrostatic bearing member;
a linear motor for moving said movable member relative to said surface plate, said linear motor having a stator fixed to said surface plate and a moving element fixed to said movable member;
a first temperature detector for detecting the temperature of said movable member;
a second temperature detector for detecting the temperature of said linear motor;
cooling means for cooling said linear motor, said cooling means being operable to supply a cooling medium, from a cooling medium tank and through a flexible tube, to a supporting member supporting a driving coil of said linear motor; and
control means for controlling said cooling means so as to reduce, to zero, a difference in temperature detected by said first and second temperature detectors, said control means being operable to change the quantity of the cooling medium to be supplied to the supporting member.

12. A device according to claim 11, wherein said cooling means includes a circulation passageway for circulating the cooling medium from the cooling medium tank through said supporting member and back to the cooling medium tank, a cooling medium by-passing passageway for by-passing the cooling medium back to the cooling tank without passing the cooling medium through the supporting member, and a plurality of flow controlling valves provided in said cooling medium circulating passageway and said cooling medium by-passing passageway for adjusting the flow rate of the cooling medium therethrough.

13. A movement guiding device, comprising:
a surface plate;
two stationary guides fixedly provided on said surface plate;
a first movable member supported by said surface plate and said stationary guides through a hydrostatic bearing member;
a second movable member placed on said surface plate so as to straddle said first movable member, said second movable member being supported by said surface plate and said first movable member through a hydrostatic bearing member;
a plurality of first linear motors for moving said first movable member relative to said surface plate in a first direction, each of said first linear motors having a stator fixed to said surface plate and a moving element fixed to said first movable member, and said first linear motors being disposed outside of said stationary guides;
a second linear motor for moving said second movable member relative to said first movable member in a second direction which is orthogonal to said first direction, said second linear motor having a stator fixed to said first movable member and a moving element fixed to said second movable member;
a first temperature detector for detecting the temperature of said surface plate;
a plurality of second temperature detectors provided on said first and second linear motors, respectively, for detecting the temperatures of said first and second linear motors;
cooling means for cooling said first and second linear motors independently of each other, said cooling means being operable to supply a cooling medium, from a cooling medium tank and through a flexible tube, to supporting members supporting driving coils of said first and second linear motors; and
control means for controlling said cooling means so as to reduce, to zero, a difference in temperature detected by said first temperature detector and said second temperature detectors, said control means being operable to change the quantity of the cooling medium to be supplied to the supporting members by said cooling means.

* * * * *

UNITED STATES PATENT AND TRADEMARK OFFICE
CERTIFICATE OF CORRECTION

PATENT NO. : 4,916,340
DATED : April 10, 1990
INVENTOR(S) : MAHITO NEGISHI

Page 1 of 3

It is certified that error appears in the above-identified patent and that said Letters Patent is hereby corrected as shown below:

COLUMN 3

Line 15, "views schematic" should read
        --schematic views--.

COLUMN 4

Line 2, "sush" should read --such--.
    Line 29, "means" should read --by means--.
    Line 50, "X stage 11 the," should read
        --X stage 11, the--.

COLUMN 5

Line 36, "increases." should read --increase.--.
    Line 41, "of" should read --to--.

COLUMN 6

Line 1, "parallel guide" should read
        --parallel guides--.

COLUMN 7

Line 18, "by-passing" should read --bypassing--.
    Line 22, "disconnecting" should read
        --by disconnecting--.
    Line 31, "change" should read --a change--.
    Line 61, "$E \approx$" should read --$e \approx$--.

UNITED STATES PATENT AND TRADEMARK OFFICE
CERTIFICATE OF CORRECTION

PATENT NO. : 4,916,340
DATED : April 10, 1990
INVENTOR(S) : MAHITO NEGISHI

It is certified that error appears in the above-identified patent and that said Letters Patent is hereby corrected as shown below:

COLUMN 8

Line 1, "advantages for" should read --advantages. For--.
    Line 25, "recitified" should read --rectified--.
    Line 28, "amplifiers" should read --amplifier--.
    Line 35, "by-passing" should read --bypassing--.
    Line 55, "of X" should read --of the X--.
    Line 61, "coil 111" should read --coils 111--.

COLUMN 10

Line 19, "sensor 100a" should read --sensor 130a--.

COLUMN 11

Line 6, "of" should be deleted.
    Line 7, "rate the" should read --rate of the--
    Line 27, "by-passing" should read --bypassing--.

COLUMN 12

Line 59, "plurality" should read --a plurality--.

COLUMN 13

Line 20, "by-passing" should read --bypassing--.
    Line 21, "by-passing" should read --bypassing--.
    Line 33, "claim 6" should read --claim 6,--.

UNITED STATES PATENT AND TRADEMARK OFFICE
CERTIFICATE OF CORRECTION

PATENT NO. : 4,916,340
DATED : April 10, 1990
INVENTOR(S) : MAHITO NEGISHI

It is certified that error appears in the above-identified patent and that said Letters Patent is hereby corrected as shown below:

COLUMN 14

Line 6, "said supporting member" should read
--the supporting member--.
Line 7, "by-passing" should read --bypassing--.
Line 8, "by-passing" should read --bypassing--.

Signed and Sealed this

Fifteenth Day of October, 1991

*Attest:*

HARRY F. MANBECK, JR.

*Attesting Officer*   *Commissioner of Patents and Trademarks*